United States Patent
Tschinderle et al.

(10) Patent No.: US 8,974,632 B2
(45) Date of Patent: Mar. 10, 2015

(54) DEVICE AND METHOD FOR TREATING WAFER-SHAPED ARTICLES

(75) Inventors: Ulrich Tschinderle, Feistritz/Gail (AT); Andreas Gleissner, Radenthein (AT); Michael Brugger, Millstatt (AT)

(73) Assignee: Lam Research AG, Villach (AT)

(*) Notice: Subject to any disclaimer, the term of this patent is extended or adjusted under 35 U.S.C. 154(b) by 228 days.

(21) Appl. No.: 13/307,421

(22) Filed: Nov. 30, 2011

(65) Prior Publication Data
US 2013/0134128 A1 May 30, 2013

(51) Int. Cl.
- C23C 16/00 (2006.01)
- C23F 1/12 (2006.01)
- B05D 5/12 (2006.01)
- B08B 3/08 (2006.01)
- H01L 21/67 (2006.01)

(52) U.S. Cl.
CPC ...... *H01L 21/67051* (2013.01); *H01L 21/6708* (2013.01); *H01L 21/67126* (2013.01); *H01L 21/6719* (2013.01)
USPC .......... 156/345.55; 118/730; 134/30; 134/33; 156/345.33

(58) Field of Classification Search
USPC .......... 156/345.33, 345.55; 118/730; 134/30, 134/33
See application file for complete search history.

(56) References Cited

U.S. PATENT DOCUMENTS

| 4,903,717 | A | 2/1990 | Sumnitsch |
| 5,513,668 | A | 5/1996 | Sumnitsch |
| 6,485,531 | B1 | 11/2002 | Schob |
| 7,052,577 | B2* | 5/2006 | Obweger ............ 156/345.55 |
| 8,231,939 | B2* | 7/2012 | Brugger et al. ........ 427/240 |
| 2006/0151014 | A1 | 7/2006 | Obweger et al. |
| 2007/0012339 | A1 | 1/2007 | Fukuda et al. |
| 2007/0277734 | A1 | 12/2007 | Lubomirsky et al. |
| 2010/0200547 | A1* | 8/2010 | Higashijima et al. ...... 216/92 |
| 2010/0206481 | A1 | 8/2010 | Gigacher et al. |
| 2013/0134128 | A1* | 5/2013 | Tschinderle et al. ...... 216/58 |

FOREIGN PATENT DOCUMENTS

WO 2007/101764 A1 9/2007

OTHER PUBLICATIONS

International Search Report, dated May 20, 2013, from corresponding PCT application.

* cited by examiner

*Primary Examiner* — Sylvia R MacArthur
(74) *Attorney, Agent, or Firm* — Young & Thompson

(57) ABSTRACT

A method and device for processing wafer-shaped articles comprises a closed process chamber. A rotary chuck is located within the process chamber, and is adapted to hold a wafer shaped article thereon. An interior fluid distribution ring is positioned above the rotary chuck, and comprises an annular surface inclined downwardly from a radially inner edge to a radially outer edge thereof. At least one fluid distribution nozzle extends into the closed process chamber and is positioned so as to discharge fluid onto the annular surface of the fluid distribution ring.

8 Claims, 2 Drawing Sheets

DEVICE AND METHOD FOR TREATING WAFER-SHAPED ARTICLES

BACKGROUND OF THE INVENTION

1. Field of the Invention

The invention relates generally to an apparatus for treating surfaces of wafer-shaped articles, such as semiconductor wafers, wherein one or more treatment fluids are introduced into a closed process chamber.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531. Treatment fluids which are driven outwardly from the edge of a rotating wafer due to centrifugal action are delivered to a common drain for disposal.

For many applications the closed process chambers need to be purged with ozone or an inert gas such as nitrogen, prior to commencement of a given process, or between successive processes. Additionally, for many applications the process chambers also need to be cleaned, for example by rinsing with deionized water. However, in conventional closed process chambers, particularly in which a wafer is supported by a ring rotor driven through an active magnetic bearing, space restrictions for introduction of purge and/or rinse fluids limits the possible flow rates and leads to disadvantageously long purge and rinse times.

SUMMARY OF THE INVENTION

The present invention in one aspect relates to a device for processing wafer-shaped articles, comprising a process chamber and a rotary chuck located within the process chamber. The rotary chuck is adapted to hold a wafer shaped article thereon. An interior fluid distribution ring is positioned above the rotary chuck, the fluid distribution ring comprising an annular surface inclined downwardly from a radially inner edge to a radially outer edge thereof. At least one fluid distribution nozzle extends into the closed process chamber and is positioned so as to discharge fluid onto the annular surface of the fluid distribution ring.

In preferred embodiments of the device according to the present invention, the rotary chuck is adapted to be driven without physical contact through a magnetic bearing.

In preferred embodiments of the device according to the present invention, the magnetic bearing comprises a stator located outside the closed process chamber.

In preferred embodiments of the device according to the present invention, the magnetic bearing is an active magnetic bearing.

In preferred embodiments of the device according to the present invention, the process chamber comprises a housing providing a gas-tight enclosure.

In preferred embodiments of the device according to the present invention, the fluid distribution ring further comprises an annular flange overlying the downwardly inclined annular surface, the at least one fluid distribution nozzle passing through the annular flange and having a discharge opening positioned above the downwardly inclined annular surface.

In preferred embodiments of the device according to the present invention, the downwardly inclined annular surface terminates radially outwardly at an edge that abuts an interior wall of the process chamber.

In preferred embodiments of the device according to the present invention, the downwardly inclined annular surface terminates radially outwardly at an edge that is spaced a predetermined distance from an interior wall of the process chamber.

In preferred embodiments of the device according to the present invention, the at least one fluid distribution nozzle comprises at least three fluid distribution nozzles distributed about a periphery of the fluid distribution ring.

In preferred embodiments of the device according to the present invention, the process chamber comprises an interior cover disposed within the process chamber. The interior cover is movable between a first position in which the rotary chuck communicates with an outer wall of the process chamber, and a second position in which the interior cover seals against an inner surface of the process chamber adjacent the rotary chuck to define a gas-tight inner process chamber. Preferably said movement between the first position and the second position is an axial movement along the rotational axis of rotary chuck.

In preferred embodiments of the device according to the present invention, the process chamber is a module in a station for single wafer wet processing of semiconductor wafers.

In preferred embodiments of the device according to the present invention, the process chamber is made of aluminum coated with perfluoroalkoxy resin.

The present invention in another aspect relates to a method for processing wafer-shaped articles, comprising supplying gas to a process chamber. A rotary chuck is located within the process chamber, and holds a wafer shaped article thereon. The gas is discharged through at least one fluid distribution nozzle extending into the process chamber and onto an upwardly facing annular surface of a fluid distribution ring. The upwardly facing annular surface is inclined downwardly from a radially inner edge to a radially outer edge thereof.

In preferred embodiments of the method according to the present invention, the annular surface of the fluid distribution ring terminates at a radially outer edge positioned adjacent an interior wall of the process chamber, and the method further comprises introducing deionized water into an annular gap between the radially outer edge and the interior wall so as to rinse the annular gap.

In preferred embodiments of the method according to the present invention, the gas is ozone, and the method further comprises introducing nitrogen into the annular gap after introducing deionized water into the annular gap.

In preferred embodiments of the method according to the present invention, the rotary chuck is driven without physical contact through a magnetic bearing.

In preferred embodiments of the method according to the present invention, the fluid distribution ring further comprises an annular flange overlying the downwardly inclined annular surface, the at least one fluid distribution nozzle passing through the annular flange and having a discharge opening positioned above the downwardly inclined annular surface.

In preferred embodiments of the method according to the present invention, the downwardly inclined annular surface terminates radially outwardly at an edge that abuts an interior wall of the process chamber.

In preferred embodiments of the method according to the present invention, the downwardly inclined annular surface terminates radially outwardly at an edge that is spaced a predetermined distance from an interior wall of the process chamber.

In preferred embodiments of the method according to the present invention, the at least one fluid distribution nozzle comprises at least three fluid distribution nozzles distributed about a periphery of the fluid distribution ring.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
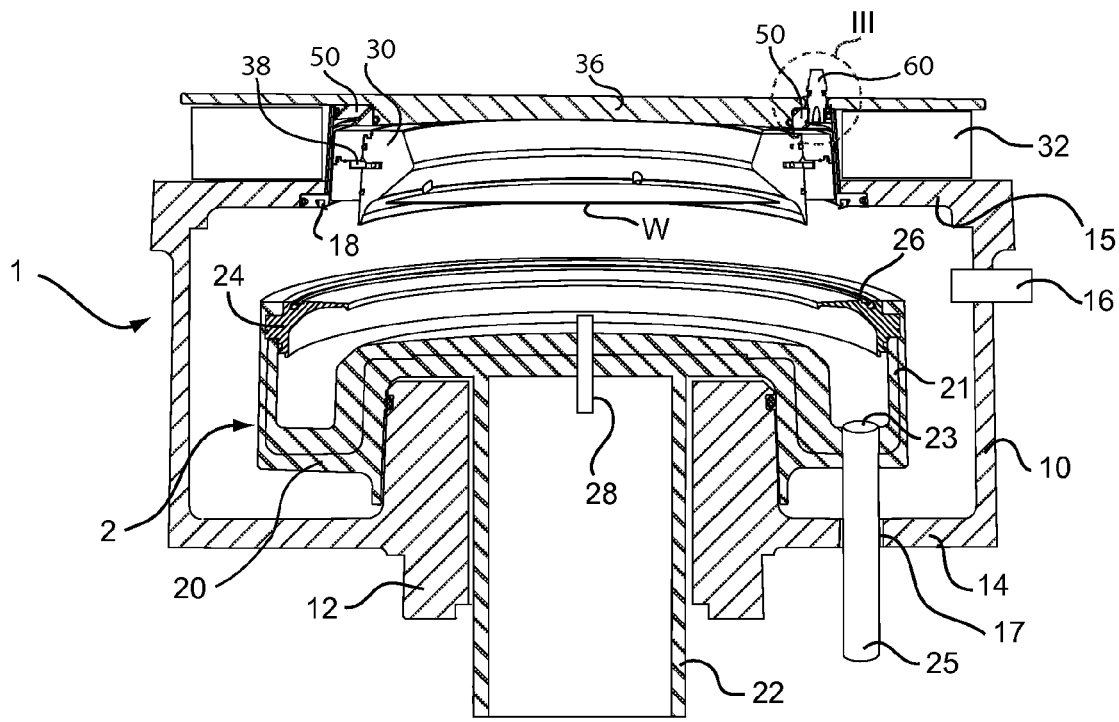
FIG. 1 is an explanatory cross-sectional side view of a process chamber according to a first embodiment of the invention, with the interior cover shown in its first position.

Referring now to FIG. 1, an apparatus for treating surfaces of wafer-shaped articles according to a first embodiment of the invention comprises an outer process chamber 1, which is preferably made of aluminum coated with PFA (perfluoroalkoxy) resin. The chamber in this embodiment has a main cylindrical wall 10, a lower part 12 and an upper part 15. From upper part 15 there extends a narrower cylindrical wall 34, which is closed by a lid 36.

A rotary chuck 30 is disposed in the upper part of chamber 1, and surrounded by the cylindrical wall 34. Rotary chuck 30 rotatably supports a wafer W during use of the apparatus. The rotary chuck 30 incorporates a rotary drive comprising ring gear 38, which engages and drives a plurality of eccentrically movable gripping members 40 for selectively contacting and releasing the peripheral edge of a wafer W.

In this embodiment, the rotary chuck 30 is a ring rotor provided adjacent to the interior surface of the cylindrical wall 34. A stator 32 is provided opposite the ring rotor adjacent the outer surface of the cylindrical wall 34. The rotor 30 and stator 34 serve as a motor by which the ring rotor 30 (and thereby a supported wafer W) may be rotated through an active magnetic bearing. For example, the stator 34 can comprise a plurality of electromagnetic coils or windings that may be actively controlled to rotatably drive the rotary chuck 30 through corresponding permanent magnets provided on the rotor. Axial and radial bearing of the rotary chuck 30 may be accomplished also by active control of the stator or by permanent magnets. Thus, the rotary chuck 30 may be levitated and rotatably driven free from mechanical contact. Alternatively, the rotor may be held by a passive bearing where the magnets of the rotor are held by corresponding high-temperature-superconducting magnets (HTS-magnets) that are circumferentially arranged on an outer rotor outside the chamber. With this alternative embodiment each magnet of the ring rotor is pinned to its corresponding HTS-magnet of the outer rotor. Therefore the inner rotor makes the same movement as the outer rotor without being physically connected.

It will be noted that the wafer W in this embodiment hangs downwardly from the rotary chuck 30, supported by the gripping members 40. In case wafer 30 is a semiconductor wafer, for example of 300 mm or 450 mm diameter, the upwardly facing side of wafer W could be either the device side or the obverse side of the wafer W, which is determined by how the wafer is positioned on the rotary chuck 30, which in turn is dictated by the particular process being performed within the chamber 1.

The apparatus of FIG. 1 further comprises an interior cover 2, which is movable relative to the process chamber 1. Interior cover 2 is shown in FIG. 1 in its first, or open, position, in which the rotary chuck 30 is in communication with the outer cylindrical wall 10 of chamber 1. Cover 2 in this embodiment is generally cup-shaped, comprising a base 20 surrounded by an upstanding cylindrical wall 21. Cover 2 furthermore comprises a hollow shaft 22 supporting the base 20, and traversing the lower wall 14 of the chamber 1.

Hollow shaft 22 is surrounded by a boss 12 formed in the main chamber 1, and these elements are connected via a dynamic seal that permits the hollow shaft 22 to be displaced relative to the boss 12 while maintaining a gas-tight seal with the chamber 1.

At the top of cylindrical wall 21 there is attached an annular deflector member 24, which carries on its upwardly-facing surface a gasket 26. Cover 2 preferably comprises a fluid medium inlet 28 traversing the base 20, so that process fluids and rinsing liquid may be introduced into the chamber onto the downwardly facing surface of wafer W.

Cover 2 furthermore includes a process liquid discharge opening 23, which opens into a discharge pipe 25. Whereas pipe 25 is rigidly mounted to base 20 of cover 2, it traverses the bottom wall 14 of chamber 1 via a dynamic seal 17 so that the pipe may slide axially relative to the bottom wall 14 while maintaining a gas-tight seal.

An exhaust opening 16 traverses the wall 10 of chamber 1, whereas a separate exhaust opening (not shown) may optionally be provided so as to traverse the lid 36 near the inner surface of rotary chuck 30. Each exhaust opening is connected to suitable exhaust conduits (not shown), which are preferably independently controlled via respective valves and venting devices.

The position depicted in FIG. 1 corresponds to loading or unloading of a wafer W. In particular, a wafer W can be loaded onto the rotary chuck 30 either through the lid 36, or, more preferably, through a side door (not shown) in the chamber wall 10. However, when the lid 36 is in position and when any side door has been closed, the chamber 1 is gas-tight and able to maintain a defined internal pressure.

Figure 2:
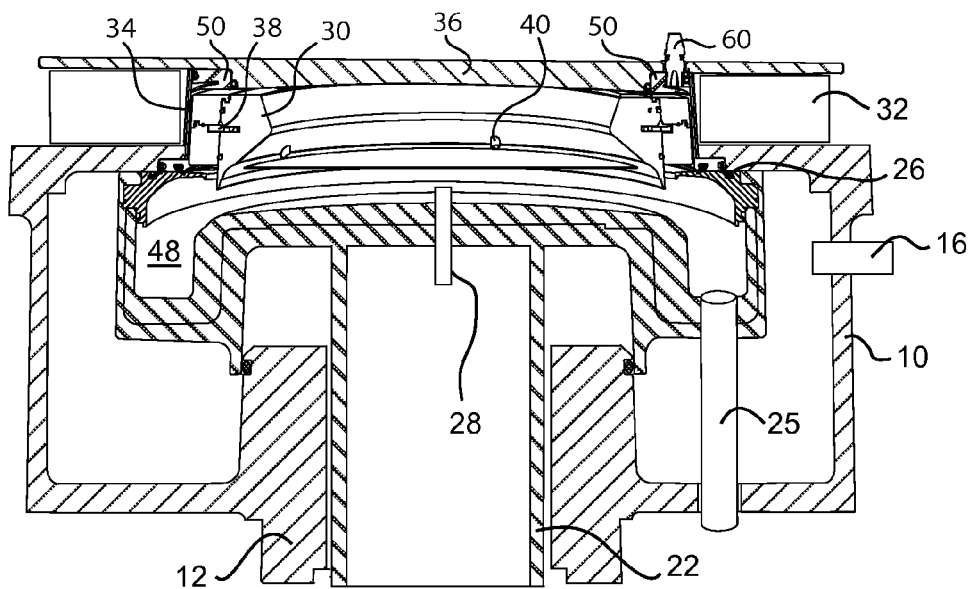
FIG. 2 is an explanatory cross-sectional side view of a process chamber according to the first embodiment of the invention, with the interior cover shown in its second position.

In FIG. 2, the interior cover 2 has been moved to its second, or closed, position, which corresponds to processing of a wafer W. That is, after a wafer W is loaded onto rotary chuck 30, the cover 2 is moved upwardly relative to chamber 1, by a suitable motor (not shown) acting upon the hollow shaft 22. The upward movement of the interior cover 2 continues until the deflector member 24 comes into contact with the interior surface of the upper part 15 of chamber 1. In particular, the gasket 26 carried by deflector 24 seals against the underside of upper part 15, whereas the gasket 18 carried by the upper part 15 seals against the upper surface of deflector 24.

Figure 3:
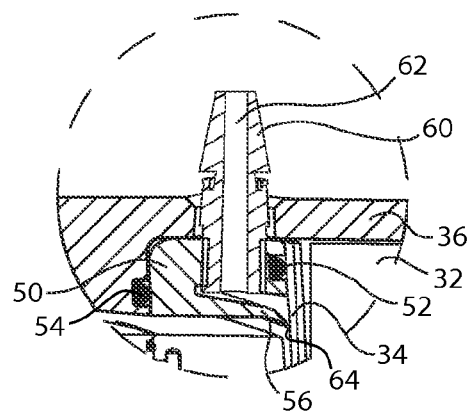
FIG. 3 is an enlarged view of the detail III of FIG. 1.
Figure 4:
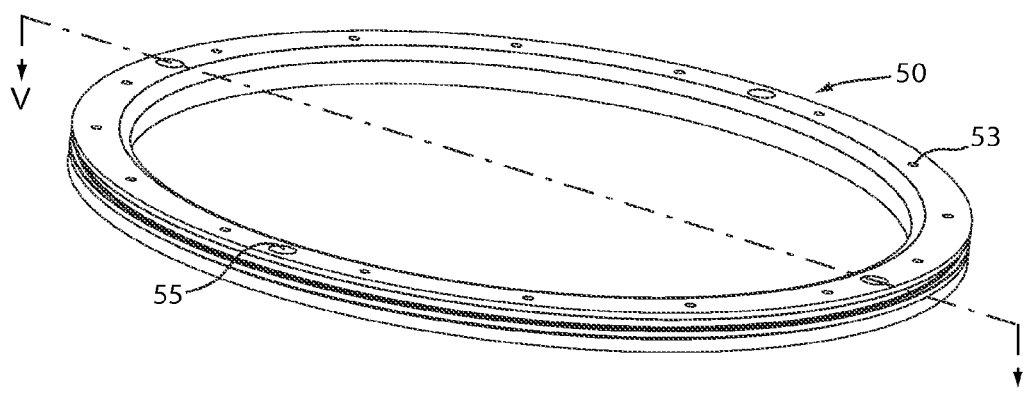
FIG. 4 is a perspective view of the fluid distribution ring according to an embodiment of the invention.
Figure 5:
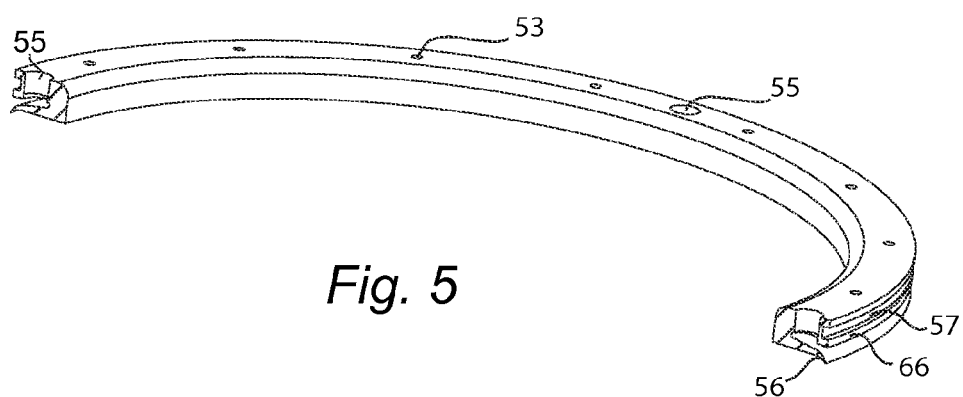
FIG. 5 is a cross-sectional view along the line V-V of FIG. 4.

The device depicted in FIGS. 1 and 2 further comprises a fluid distribution ring 50, as shown in greater detail in FIGS. 3-5.

Fluid distribution ring 50 provides significant advantages relative to a single gas inlet, located near the center of the lid 36, especially when used to introduce nitrogen or ozone into the process chamber. Those gases are used to generate a defined atmosphere around the wafer to either avoid corrosion or support etching on the wafer. However, due to the restrictions in space, the flow rates possible when using a single central nozzle are fairly low, resulting in remarkably long purge times.

Fluid distribution ring 50 provides an annular gap to the lid assembly of the process chamber. This gap enables high gas volumes to be introduced into the chamber, and enables therefore much shorter purge times. Shorter purge times reduce process time and increase throughput. Furthermore, the annular gap can be used to rinse and dry the chamber upper portion and the chuck with deionized water and nitrogen gas, respectively.

Referring now to FIG. 3, it will be seen that the fluid distribution ring 50 is sealed in a gas-tight manner against the lid 36 by a gasket 54, and against the chamber wall 34 by a gasket 52. Ring 50 comprises a tapered flange 56 that presents to the discharge outlet of nozzles 60 an upper annular surface that is inclined downwardly from a radially inner edge to a radially outer edge thereof.

Ring 50 may be formed of any suitable material that is chemically and thermally resistant to the process conditions of the chamber 1 in use. Suitable materials include, for example, polyetheretherketone (PEEK) and polytetrafluoroethylene (PTFE).

Ring 50 may be fashioned such that it is sufficiently rigid to resist substantial downward deflection by process gases and liquids introduced through the nozzles 60. In that case, ring 60 is dimensioned relative to chamber wall 34 such that an annular gap 64 of a predetermined width is present between the radially outermost edge of the tapered flange 56 and the inside of wall 34. Gap 64 may be for example 0.1-5 mm, preferably 0.5-3 mm, and more preferably 1-2 mm in its radial extent.

Alternatively, ring 50 may be fashioned such that it is relatively more resilient, and in particular such that the tapered flange 56 is deflected downwardly by process gases and liquids introduced through the nozzles 60. In that case, ring 60 is dimensioned relative to chamber wall 34 such that the radially outermost edge of the tapered flange 56 abuts the inside of wall 34 absent fluid flow through nozzles 60, whereas gap 64 will be created dynamically upon commencement of fluid flow through nozzles 60.

As can be seen in FIGS. 4 and 5, ring 50 also includes an upper flange 57, which in this embodiment is provided with mounting holes 53 for securing the ring 50 to the underside of lid 36, as well as openings 55 to permit passage of the fluid distribution nozzles 60. In this embodiment there are four openings 55 and hence four nozzles 60. Preferably there are at least three nozzles 60 evenly distributed over the ring 60, i.e., at a spacing of about 120°; however, the number of nozzles in practice can be as few as one and as many as desired.

Ring 50 furthermore comprises a channel 66 to receive the previously-discussed gasket 52.

In use, process gas such as ozone can be introduced into the upper part of chamber 1 more readily by virtue of ring 50, and also more readily purged from the gap 64 using a non-oxidizing gas such as nitrogen. The design of ring 50 and nozzles 60 furthermore facilitates rinsing of the gap 64 using for example deionized water. In this respect, it should be noted that the same nozzles 60 may alternately supply process gases and deionized water; or, alternatively, certain ones of the nozzles 60 may be dedicated to supply only one process fluid, with other ones of the nozzles 60 dedicated to supply different respective process fluids.

What is claimed is:

1. Device for processing wafer-shaped articles, comprising a process chamber, a rotary chuck located within said process chamber, said rotary chuck being adapted to hold a wafer shaped article thereon, an interior fluid distribution ring positioned above said rotary chuck, said fluid distribution ring comprising an annular surface inclined downwardly from a radially inner edge to a radially outer edge thereof, and at least one fluid distribution nozzle extending into said process chamber and being positioned so as to discharge fluid onto said annular surface of said fluid distribution ring.

2. The device according to claim 1, wherein said rotary chuck is adapted to be driven without physical contact through a magnetic bearing.

3. The device according to claim 1, wherein said process chamber comprises a housing providing a gas-tight enclosure.

4. The device according to claim 1, wherein said fluid distribution ring further comprises an annular flange overlying said downwardly inclined annular surface, said at least one fluid distribution nozzle passing through said annular flange and having a discharge opening positioned above said downwardly inclined annular surface.

5. The device according to claim 1, wherein said downwardly inclined annular surface terminates radially outwardly at an edge that abuts an interior wall of said process chamber.

6. The device according to claim 1, wherein said downwardly inclined annular surface terminates radially outwardly at an edge that is spaced a predetermined distance from an interior wall of said process chamber.

7. The device according to claim 1, wherein said at least one fluid distribution nozzle comprises at least three fluid distribution nozzles distributed about a periphery of said fluid distribution ring.

8. The device according to claim 1, wherein said process chamber comprises a lid that closes an upper part of said process chamber, and wherein said fluid distribution ring is comprised by said lid.

* * * * *